United States Patent [19]

Kadomura

[11] Patent Number: 4,654,114

[45] Date of Patent: Mar. 31, 1987

[54] DRY ETCHING METHOD FOR SELECTIVELY ETCHING SILICON NITRIDE EXISTING ON SILICON DIOXIDE

[75] Inventor: Shingo Kadomura, Kanagawa, Japan

[73] Assignee: Sony Corporation, Tokyo, Japan

[21] Appl. No.: 809,004

[22] Filed: Dec. 16, 1985

[30] Foreign Application Priority Data

Dec. 17, 1984 [JP] Japan .................................. 59-265577

[51] Int. Cl.$^4$ ............................................. B44C 1/22
[52] U.S. Cl. .................................. 156/643; 156/657; 156/662
[58] Field of Search ............... 156/643, 646, 657, 662, 156/633

[56] References Cited

U.S. PATENT DOCUMENTS

| | | | |
|---|---|---|---|
| 4,381,967 | 5/1983 | Sanders | 156/643 |
| 4,412,119 | 10/1983 | Komatsu et al. | 156/643 X |
| 4,431,477 | 2/1984 | Zajac | 156/643 |
| 4,465,552 | 8/1984 | Bobbio et al. | 156/643 |
| 4,511,430 | 4/1985 | Chen et al. | 156/643 |

Primary Examiner—Robert Lindsay
Attorney, Agent, or Firm—Hill, Van Santen, Steadman & Simpson

[57] ABSTRACT

A dry etching method for selectively etching a silicon nitride having the generic formula $Si_xN_y$ existing over a base of $SiO_2$ utilizing, as the etchant gas, a mixture of a fluorohydrocarbon in which the atomic ratio of F/C is smaller than 3:1, the mixture containing 30–70% of $CO_2$ on a flow rate basis. The presence of such a large amount of $CO_2$ in the etchant in combination with the particular fluorohydrocarbons is effective for enhancing the selective ratio of etching between $Si_xN_y$ and $SiO_2$ and also for preventing formation of obstructive polymers of fluorocarbons.

4 Claims, 2 Drawing Figures

DRY ETCHING METHOD FOR SELECTIVELY ETCHING SILICON NITRIDE EXISTING ON SILICON DIOXIDE

BACKGROUND OF THE INVENTION

1. Field of the Invention

This invention is in the field of selective etching of silicon nitrides overlying a substrate of $SiO_2$ and involves the use of an etchant gas including a fluorohydrocarbon and a substantial amount of $CO_2$.

2. Description of the Prior Art

In conventional dry etching methods for etching silicon nitride films (usually designated $Si_3N_4$ films) formed on an $SiO_2$ film in the process of fabricating semiconductor devices, the etchant gas is usually a mixture of tetrafluoro methane ($CF_4$) and $0_2$, sometimes containing an additional diluent gas such as argon. The apparatus for industrial practice of this dry etching method includes tunnel-type plasma etchers, parallel plate plasma etchers of the anode coupling type and chemical dry etching (CDE) of the separate discharge chamber type. When operating such dry etching apparatus using a conventional etchant, it is possible to etch the $Si_3N_4$ film at a selective ratio (about 5:1) between the $Si_3N_4$ and the underlying $Si0_2$ film. However, in each case the etching is accomplished in the manner of isotropic etching because the reaction mechanisms inherent in the etching apparatus and particularly the mechanisms of reactions which occur when radicals formed by dissociation of $CF_4$ attack the $Si_3N_4$ and $SiO_2$ films. As a result, side etching occurs beneath the mask.

With the recent trend toward further miniaturization of semiconductor devices, it has become difficult to satisfy fully the requirements of the $Si_3N_4$ films by conventional isotropic etching. It will soon become indispensable to accomplish anisotropic etching in exact conformity with the pattern dimensions of the mask by employing reactive ion etching (RIE). When etching a $Si_3N_4$ film laid on a $SiO_2$ film by a conventional RIE technique, there is no alternative to using an etchant gas which also etches $Si0_2$. Therefore, it is difficult to accomplish good selectivity of the etcl hing rate between the $Si_3N_4$ film and the underlying $SiO_2$ film. Trifluoro methane ($CHF_3$) is well known as an etchant gas for reactive ion etching of $SiO_2$. When, for example, $O_2$ is added to $CHF_3$ at a $CHF_3/O_2$ ratio of 40/7 on a flow rate (sccm) basis to etch either $Si_3N_4$ or $SiO_2$ at a pressure of 0.06 Torr and a radio-frequency power of 400 W (0.20 W/cm$^2$), the etching rate is 980 Å for $Si_3N_4$ and 510 Å for $SiO_2$. Thus, the $Si_3N_4/SiO_2$ selective ratio is only 1.9 though anisotropic etching is accomplished without significant undercutting. Since the controllability must also be taken into consideration, this method is deemed to be impractical for a process in which good selectivity of etching between a silicon nitride film and an underlying silicon dioxide layer is required. For example, the same method is not useful for etching $Si_3N_4$ which exists as a selective oxidation mask on a thin pad of $SiO_2$.

Recently, an etching gas consisting of difluoro methane ($CH_2F_2$) was reported in the International Electric Device Meeting, 1983, under the title "VLSI Device Fabrication Using a Unique, Highly-Selective $Si_3N_4$ Dry Etching". This etchant attracted interest as a promising solution to the above described problem. However, some problems still remain unsolved as to the practical use of this etchant gas. For example, when this etchant gas is used under conditions of high selectivity, it often results in the production of a polymer film which is difficult to remove from the surface after etching. A considerable etching residue thus may adhere to the substrate surface after etching. It is probable that such phenomena are attributable to the fact that $CH_2F_2$ has a lower C/F ratio than $CF_4$ and $CHF_3$ which are conventionally used for etching $Si_3N_4$, and that the etchant gas contains $H_2$ within the molecule. Because of the nature of $CH_2F_2$, a considerably carbon-rich condition is produced in the plasma of etchant gas so that polymers of fluorocarbons are likely to be deposited on the surface after etching. A probable cause of the existence of etching residue on the substrate surface is an accumulation of such polymers. In addition, accumulation of the polymers in the chamber of the etching device is considerable. Due to these considerations, it is practically impossible to perform stable etching operations with good reproducibility using this type of etchant.

With respect to the commonly used fluorine-containing etchant gases such as $CF_4$ and $CHF_3$, it has been suggested to add a small amount of $O_2$ $CO_2$, viz. about 5% in most cases and up to about 10% at the maximum, for the purpose of suppressing formation of fluorocarbon polymers. This technique is based on the thought that oxygen radicals formed in the plasma of the mixed gas were removed carbon by converting it into CO and/or $CO_2$ with the effect of increasing the F/C ratio in the plasma and thereby preventing deposition of the polymers. Additionally, the etch rate of $Si_3N_4$ becomes higher when the etching gas contains a small amount of $O_2$ or $CO_2$. However, when using such a mixed gas for etching of $Si_3N_4$ on top of $SiO_2$, the etch rate of the underlying $SiO_2$ also increases because of the suppression of the formation of the polymers which are effective to prevent etching of $SiO_2$. Consequently, the selective ratio of etching between $Si_3N_4$ and $SiO_2$ becomes very much lower than the desired or tolerable level. This deficiency is not fundamentally removed even when $CO_2$ is added to the etching gas instead of $O_2$

SUMMARY OF THE INVENTION

The present invention provides a dry etching method by means of which silicon nitride $Si_xN_y$ existing on a substrate of $SiO_2$ can be etched at a sufficiently high selective ratio between $Si_xN_y$ and $SiO_2$ without providing for deposition of an obstructive polymer film or any other phenomenon which provides difficulty for practical etching operations.

The present invention provides a dry etching method for selectively etching a silicon nitride existing on $SiO_2$ with an etchant gas containing a fluorohydrocarbon which contains at least one carbon atom and at least one fluorine atom, and in which the atomic ratio of F/C is less than 3:1. This fluorohydrocarbon or mixtures of such fluorohydrocarbons is admixed with $CO_2$ in an amount of 30–70% of the mixture on a flow rate basis.

The preferred examples of etchants according to the present invention are $CH_2F_2$ and $CH_3F$.

The basic feature of the invention is to add a considerable amount of $CO_2$ to a fluorohydrocarbon having a low F/C ratio. In a mixed etchant gas according to the present invention, the amount of $CO_2$ is made large enough to remove the fluorine radical F* formed in the plasma of the etchant gas by converting it into COF, thereby suppressing recombination of F* and resultant formation of $CF_3^+$. Since $CF_3^+$ acts as a strong etchant for $SiO_2$, the suppression of its formation leads to a lowering of the etch rate of $SiO_2$. In contrast, etching of $Si_3N_4$ (a usual example of a silicon nitride $Si_xN_y$) is not significantly influenced by the disappearance of $CF_3^+$ since $Si_3N_4$ is efficiently etched by other ions and radicals. Therefore, the $Si_3N_4/SiO_2$ selective ratio upon etching becomes high enough so that the intended selective etching can be realized. Furthermore, the etching method according to the present invention does not encounter the difficulties or problems of deposition or accumulation of polymers or fluorocarbons when $CH_2F_2$ alone is used as the etchant gas. Accordingly, the etching method is fully practical in the fabrication of semiconductor devices and the like.

The addition of a large amount of $CO_2$ to a fluorohydrocarbon gas having a low F/C atomic ratio is based on an entirely different concept than the addition of $CO_2$ or $O_2$ to a conventional etching gas which has a higher F/C ratio. In the prior art, the principal purpose of the addition of $O_2$ or $CO_2$ was to capture carbon in the plasma of the etchant gas. For example, in the case of a mixture of $CF_4$ and about 5% $O_2$ used for etching either monosilicon or polysilicon, the primary effect of the added $O_2$ is to prevent the roughening of the silicon surface which results from a masking influence of carbon which falls and lies on the silicon surface if not captured. In addition, the etching rate of silicon increases since the F/C ratio increases as carbon is captured by oxygen. In the case of RIE of $SiO_2$ with $CHF_3$, a small amount of $CO_2$ (less than 10%) is added instead of $O_2$. Although $O_2$ is more effective for the prevention of formation of the obstructive polymers, the addition of $O_2$ tends to lower the selective ratio of etching between $SiO_2$ and the substrate material, Si, because too much carbon is captured by oxygen. For this reason, a small amount of the less effective $CO_2$ is added to $CHF_3$.

In an etchant gas according to the present invention, a large amount of $CO_2$ is included for the purpose of preventing recombination of the fluorine radical in the plasma to thereby prevent formation of an etchant for $SiO_2$. There is thus a clear difference in scientific approach between this concept and the presence of a small amount of $CO_2$ in conventional etchant gases. Furthermore, even if a large amount of $CO_2$ is added to an etchant gas high in F/C ratio, such as $CF_2$ or $CHF_3$, it is not possible to secure the beneficial effects of the present invention. When using a fluorohydrocarbon having a low F/C ratio, such as $CH_2F_2$ or $Ch_3F$, the $CF_3^+$ which acts as a strong etchant for $SiO_2$ is formed exclusively by recombination of radicals in the plasma. Accordingly, the capture of fluorine radicals is very effective for reducing the etching rate of $SiO_2$. However, in the case of $CF_4$ or $CHF_3$ the capture of free F* by CO* originating from $CO_2$, or resultant suppression of the recombination reaction to form $CF_3^+$, has little influence on the etch rate of $SiO_2$ since most of the dissociated $CF_4$ or $CHF_3$ turns into $CF_3^+$. The beneficial effect of the addition of a large amount of $CO_2$ on the $Si_3N_4/SiO_2$ selective ratio can be obtained only when the principal component of the etchant gas is a compound having a sufficiently low F/C atomic ratio.

BRIEF DESCRIPTION OF THE DRAWINGS

A further description of the present invention will be made in conjunction with the attached sheets of drawings in which.

DESCRIPTION OF THE PREFERRED EMBODIMENTS

Figure 1:
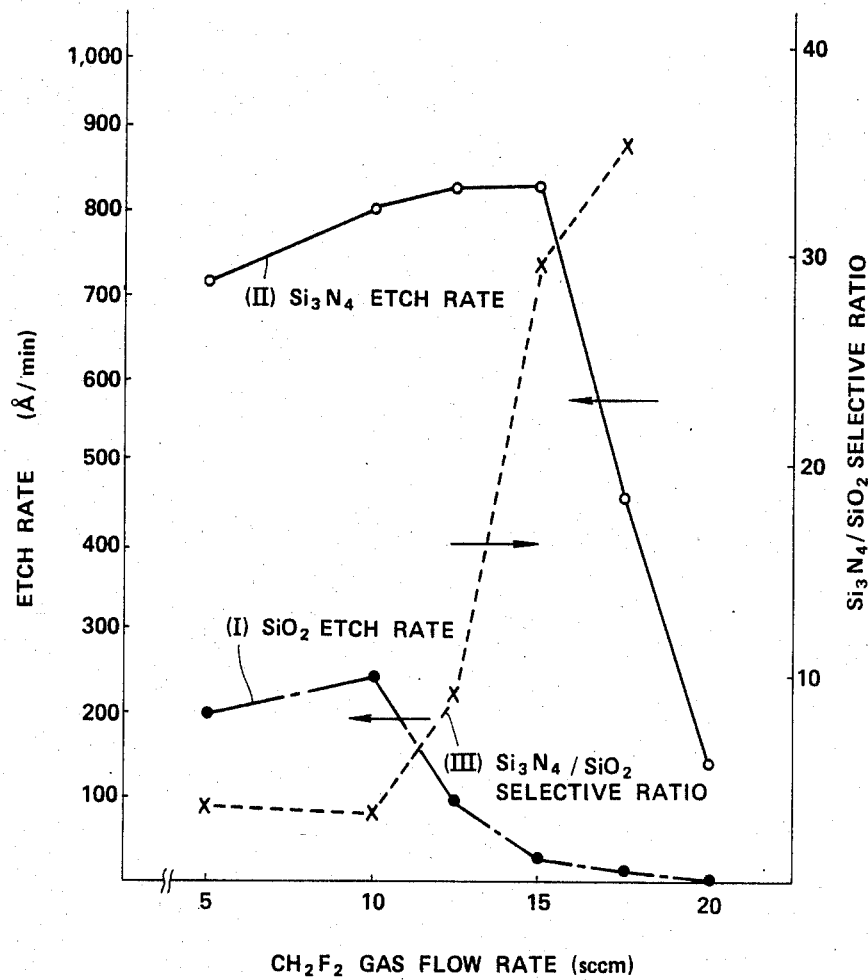
FIG. 1 is a graph showing the relationship of etch rate of $Si_3N_4$ and $SiO_2$ and the flow rate of $CH_2F_2$ used as the etchant gas for reactive ion etching.

In the present invention, $CH_2F_2$ is the preferred etchant gas material. By using this gas under appropriate conditions it is possible to attain a sufficiently high etch rate for $Si_3N_4$ while the etch rate for $SiO_2$ is very low. FIG. 1 shows variations in etch rates of $Si_3N_4$ and $SiO_2$ when etched in a parallel plate type RIE apparatus using $CH_2F_2$ alone as the etchant gas at various flow rates. The etching apparatus was operated at a pressure of 5 Pa, an rf power of 350 W and an rf power density of 0.28 W/cm². Quartz was used as the lower electrode cover. As shown by curve (I), the etch rate of $SiO_2$ becomes sharply lower as the flow rate of $CH_2F_2$ gas is increased. As shown by curve (II), the etch rate of $Si_3N_4$ is very high when the flow rate of $CH_2F_2$ gas increases up to about 15 sccm so that the $Si_3N_4/SiO_2$ selective ratio, curve (III), reached about 30 which is a very high value. However, when $CH_2F_2$ gas is used alone there arise the aforementioned problems attributed to the formation of obstructive polymers.

Figure 2:
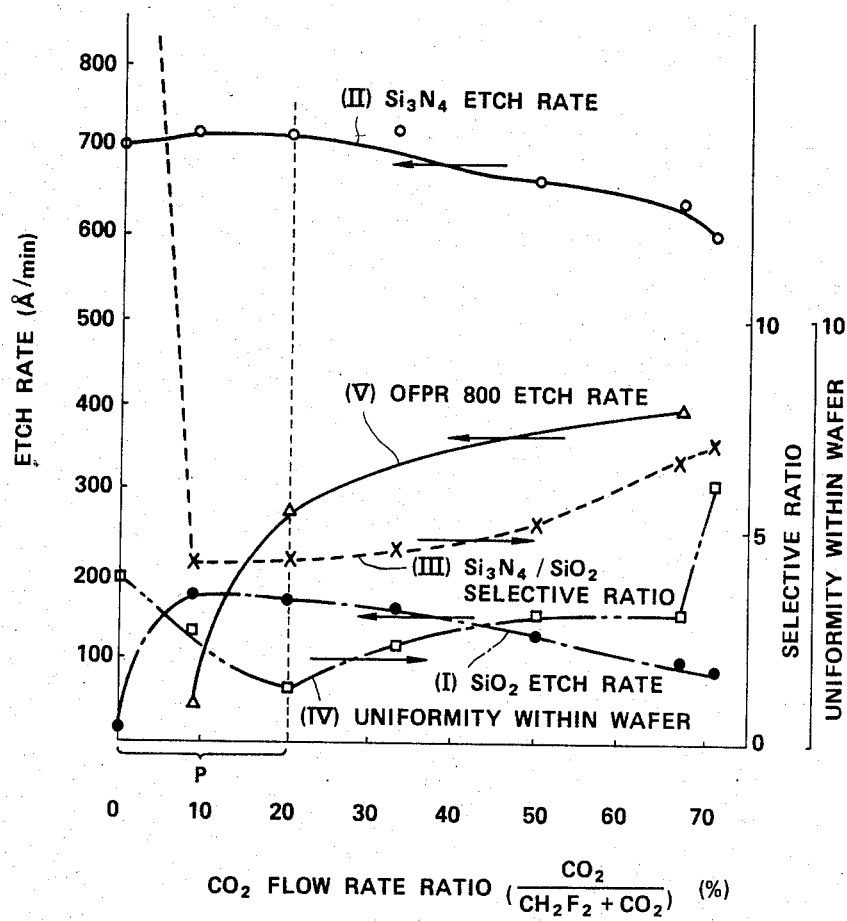
FIG. 2 is a graph showing the changes in etch rates of $Si_3N_4$ and $SiO_2$ and in the $Si_3N_4/SiO_2$ selective ratio in relation to the amount of $CO_2$ in an etchant gas consisting of $CH_2F_2$ and $CO_2$.

FIG. 2 shows the variation in etch rate of $Si_3N_4$ and $SiO_2$ when a variable amount of $CO_2$ was added to the $CH_2F_2$ gas. In this case, the aforementioned RIE apparatus was operated at a pressure of 5 Pa, an rf power of 300 W and an rf power of power density of 0.24 W/cm². The flow rate of the etchant gas containing a variable amount of $CO_2$ was a constant 10 sccm. As shown by curve (I), the etch rate of $SiO_2$ gradually decreased as the amount of $CO_2$ in the etching gas was increased, although an increase in etch rate was observed when the amount of $CO_2$ was increasing up to about 10–20%. The etch rate of $Si_3N_4$, represented by curve (II), was fairly high and was not greatly affected by the amount of $CO_2$ in the etchant gas. When the $CO_2$ amounted to 70% of the etchant gas, the etch rate of $Si_3N_4$ was about 600 Å/min and the etch rate of $SiO_2$ was as low as 80 Å/min, so that the $Si_3N_4/SiO_2$ selective ratio represented by curve (III) reached a highly acceptable value of about 7. When the amount of $CO_2$ in the etching gas was 30–70%, neither accumulation of obstructive polymers nor existence of etching residue was detected.

In the plasma of the etchant gas, the recombination reaction to form a strong etchant for $SiO_2$ is represented by the equation:

$$CF_2^+ + F^* \rightarrow CF_3^+$$

WHen the etchant gas is a mixture of 30–70% of $CO_2$ and the balance $CH_2F_2$, such a recombination reaction is effectively suppressed by the following reactions. First, a sufficiently large amount of CO* is formed by dissociation of $CO_2$.

$$CO_2 \rightarrow CO^* + O^*$$

At the same time, F* is formed by dissociation reactions of $CH_2F_2$ such as:

$$CH_2F_2 \rightarrow CH_2F + F*$$

However, the F* is soon consumed in the following reaction.

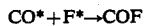

$$CO* + F* \rightarrow COF$$

Thus, there is always a lack of F* in the plasma, and the aforementioned recombination reaction does not become significant.

While etching of $SiO_2$ is suppressed by the above phenomena, $Si_3N_4$ undergoes efficient etching with radicals and ions other than $CF_3^+$ since the binding energy of the Si-N bond, 50 kcal/mole, is considerably lower than the binding energy of the Si-O bond, 80 kcal/mole. These reasons probably explain the success in the good selective etching of $Si_3N_4$ on $SiO_2$ by using an etching gas which has a low F/C ratio and contains a large amount of $CO_2$.

In FIG. 2, it will be seen that the etch rate of $SiO_2$ increases when the amount of $CO_2$ is increasing up to 10–20%. Presumably this is because in this region of $CO_2$ content, the carbon capturing effect of O* formed by dissociation of $CO_2$ overcomes the F* capturing effect of CO*.

In FIG. 2, curve (IV) represents the degree of uniformity of the wafer on which the selective etching was performed. Accordingly, curve (IV) represents the degree of uniformity of etching of the $Si_3N_4$ film.

In the region P indicated in FIG. 2, where the amount of $CO_2$ in the etchant gas is less than 20%, deposition of obstructive polymers was observed in the experiment. Therefore, this region is unsuitable for practical operations at least under the etching conditions employed in the experiment.

The curve (V) in FIG. 2 represents the etch rate of a conventional resist, OFPR 800. From curve (V) it will be understood that a tapered etching of $Si_3N_4$ can be accomplished while maintaining a good selective ratio between the $Si_3N_4$ and the underlying $SiO_2$ by first forming a tapered resist film to thereby utilize the low $Si_3N_4$/OFPR selective ratio. The increase in etch rate of the resist represented by curve (V) is caused by the action of O* formed by dissocation of $CO_2$.

It will be understood that various modifications can be made to the described embodiments without departing from the scope of the present invention.

I CLAIM AS MY INVENTION:

1. In a dry etching method for selective etching of a silicon nitride existing on a surface of $SiO_2$ with an etchant gas containing a fluorohydrocarbon, the improvement which comprises:

employing as said etchant gas a mixture of a fluorohydrocarbon having an atomic ratio of F to C less than 3:1 and $CO_2$ in an amount of 30–70% of said mixture on a flow rate basis.

2. A dry etching method according to claim 1 wherein said fluorohydrocarbon is $CH_2F_2$.

3. A dry etching method according to claim 1 wherein said fluorohydrocarbon is $CH_2F_2$.

4. A dry etching method according to claim 1 wherein said silicon nitride is $Si_3N_4$.

* * * * *